United States Patent [19]

Kamemoto

[11] 4,451,850

[45] May 29, 1984

[54] CHANNEL SELECTING DEVICE

[75] Inventor: Kazuhiro Kamemoto, Kumagaya, Japan

[73] Assignee: Tokyo Shibaura Denki Kabushiki Kaisha, Kawasaki, Japan

[21] Appl. No.: 289,077

[22] Filed: Jul. 31, 1981

[30] Foreign Application Priority Data

Aug. 5, 1980 [JP] Japan .................. 55-107284

[51] Int. Cl.³ .............................................. H04N 5/44
[52] U.S. Cl. ............................ 358/191.1; 358/193.1; 455/165; 455/183
[58] Field of Search ..................... 358/191.1, 193.1; 455/183, 165

[56] References Cited

U.S. PATENT DOCUMENTS 4,214,274 7/1980 Rzeszewski et al. ............ 358/193.1

OTHER PUBLICATIONS

Frequency Synthesis Tuning Systems with Automatic Offset Tuning, B. W. Beyers et al., IEEE Trans, vol. CE 24, No. 3, Aug. 1978, pp. 419–425.
A Microcomputer Controlled Frequency Synthesizer for TV Trzeszewski et al., IEEE Trans., vol. 24, No. 3, May 1978, pp. 145–154.

Primary Examiner—Richard Murray
Attorney, Agent, or Firm—Cushman, Darby & Cushman

[57] ABSTRACT

A frequency synthesizer type of the channel selecting device using a PLL wherein the local oscillation output is frequency-divided by a predetermined frequency dividing ratio according to a channel and compared in phase with a reference oscillation output, a signal corresponding to the phase difference is supplied to a tuner to change the local oscillation frequency thereof. A horizontal synchronizing signal is detected to determine whether or not a broadcast signal is transmitted through the channel, and when no broadcast signal is transmitted through the channel. Other channels are searched successively until a channel through which a broadcast signal is transmitted is found. The channel selecting device shifts the local oscillation output of the tuner from the predetermined frequency dividing ratio at the time of channel searching to thereby make the local oscillation frequency lower than the normal local oscillation frequency and returns the lowered local oscillation of frequency to the predetermined frequency dividing ratio when the presence of the broadcast signal is detected.

3 Claims, 31 Drawing Figures

FIG. 13

CHANNEL SELECTING DEVICE

BACKGROUND OF THE INVENTION

The present invention relates to an electric channel selecting device and, more particularly, to a channel selecting device having a so-called channel search function to automatically discriminate a broadcast signal in a receiving channel.

Figure 1:
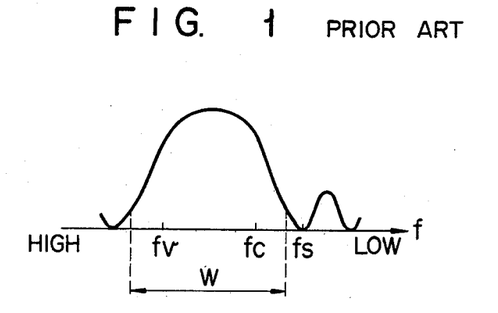
FIG. 1 is a view showing the general band-pass characteristic of an video intermediate frequency amplifier circuit in a television receiver.

There has been developed the frequency synthesizer type of the channel selecting device using the PLL (phase locked loop). This channel selecting device compares the output from a local oscillator of a tuner, which has been frequency-divided, with the reference oscillation output in phase and frequency and controls the local oscillation frequency according to the result of the comparison. According to the conventional channel selecting device, setting of a receiving channel of a channel selection is achieved by changing the frequency dividing ratio of the output from the local oscillator to control the local oscillation frequency. To this device can also be added the automatic channel searching function in which a broadcast signal is present in such a way that when a channel is selected, it is discriminated whether or not a broadcast signal is present in this channel and when no broadcast signal is present, the same operation is repeated changing the channel to the others. In the case of television channel selecting device, a video carrier signal, sound carrier signal, synchronizing signal, output signal of an AFT discriminator (which will be hereinafter referred to as an AFT signal) if an AFT (automatic frequency tuning) circuit is arranged, and the like are employed to discriminate a broadcast signal in a channel. Ideally, use of all of these signals under a predetermined condition to discriminate such a broadcast signal prevents mis-discrimination in channel. However, a circuit arrangement for using these signals as a discriminating reference signal becomes complicated and high in cost. On the other hand, when channel discrimination is carried out using only one of these signals, mistake in channel search operation is caused as follows: When channel discrimination is carried out using only the horizontal synchronizing signal, the general band-pass characteristic of an video intermediate frequency amplifier circuit in the television receiver is as shown in FIG. 1 in which the frequency is shown as in intermediate frequency resulting from subtracting actual frequency from the local oscillation frequency and the axes shown in these views are directed to the minus direction. $f_v$, $f_c$ and $f_s$ represent those frequencies of video carrier, chrominance subcarrier and sound carrier, respectively. Horizontal synchronizing signal can be detected in rather broader range as shown by W. Due to rather broader band-pass range, unnecessary signals or signals other than expected horizontal synchronizing signal are also passed therethrough.

Figure 2A:
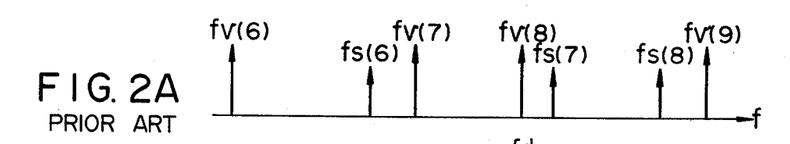
FIGS. 2A through 2C are characteristic views showing influences of signals in the eighth channel at the time of receiving the seventh channel in Japan.
Figure 2B:
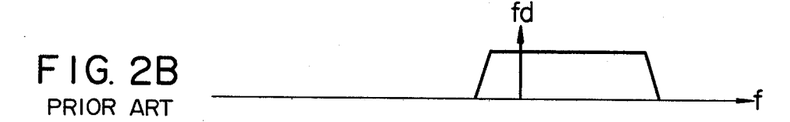
Figure 2C:
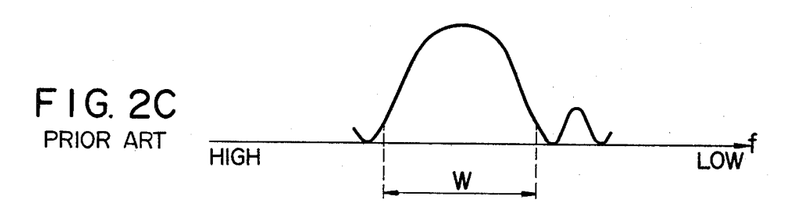

Allocation of frequency band might cure this misdiscrimination. Each of channels is usually allocated with its frequency band of 6 MHz not overlapped on any of those of other channels. However, in the CATV system or a particular case, frequency bands are sometimes overlapped on each other between closest channels. In Japan, for example, the seventh channel of VHF is allocated to have a range of 188-194 MHz while the eighth channel to have a range of 192-198 MHz, thus causing frequency bands of both channels to be overlapped on each other in a range of 192-194 MHz, (FIG. 2A). $f_v(n)$ and $f_s(n)$ denote carrier frequencies of video signal and sound signal in the nth channel. $f_v(7)$ and $f_v(8)$ have a range of 4 MHz interposed therebetween. Accordingly, even if the seventh channel is received, the carrier of video signal in the eighth channel as shown in FIG. 2B is amplified by an IF amplifier circuit which has such a band-pass characteristic as shown in FIG. 2C. The trapezoidal portion of FIG. 2B shows a sideband component of the video carrier signal of the eighth channel. When only the horizontal synchronizing signal is used like this to discriminate whether or not the broadcast signal is present, the horizontal synchronizing signals of video signals in the eighth channel are wrongly detected at the time of receiving the seventh channel even if no broadcast signal is actually present in the seventh channel, thus resulting in a mistake in channel search. Namely, providing that the carrier frequency of unnecessary signal when the seventh channel is to be received is represented by $f_d$(MHz), this $f_d$ can be expressed as follows:

$$f_d = [f_v(7) + (4)] \text{MHz} \tag{1}$$

As described above, the overlap of frequency bands between two channels is a reason why mis-discrimination is caused relating to whether or not a broadcast signal is present.

Another mis-discrimination is caused by cross modulation $f_d$ of high harmonic wave components which will be expressed by the following equations (2) or (3).

$$f_d = 2f_s(n-1) - f_v(n-1) \tag{2}$$
$$= [f_v(n-1) + 4.5] \text{MHz}$$
$$f_d = 2f_v(n+1) - f_s(n+1) \tag{3}$$
$$= [f_v(n+1) - 4.5] \text{MHz}$$

Figure 3A:
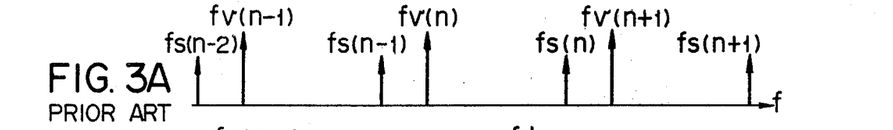
FIGS. 3A through 3D are characteristic views showing how high harmonic wave components of signals in adjacent channels are cross-modulated.
Figure 3B:
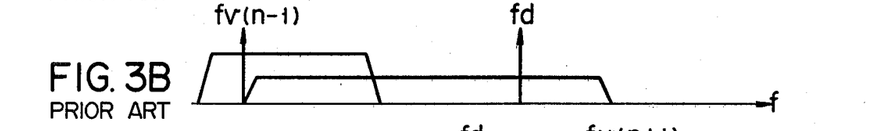
Figure 3C:
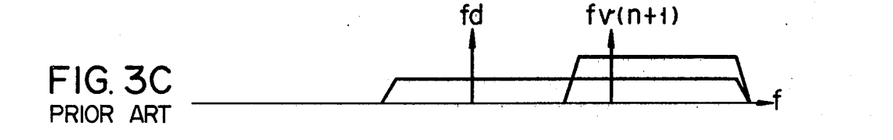
Figure 3D:
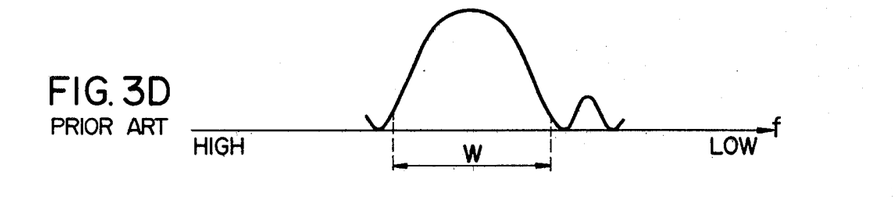

Equation (2) represents a frequency of a cross modulation signal caused by a video signal in a channel which is lower by one channel from the channel to be received, and equation (3) a frequency of a cross modulation signal caused by a video signal in a channel which is higher by one channel from the channel to be received. FIG. 3A shows the allocated frequency of each of channels, FIGS. 3B and 3C show carriers and side band components of unnecessary signals resulting from equations (2) and (3), respectively, and FIG. 3D shows the band-pass characteristic of the video IF amplifier at the time of receiving the nth channel. As apparent from these Figures, wrong channel search is caused by the cross modulation between the video signal and sound signal in channels adjacent to the channel to be received.

Figure 4:
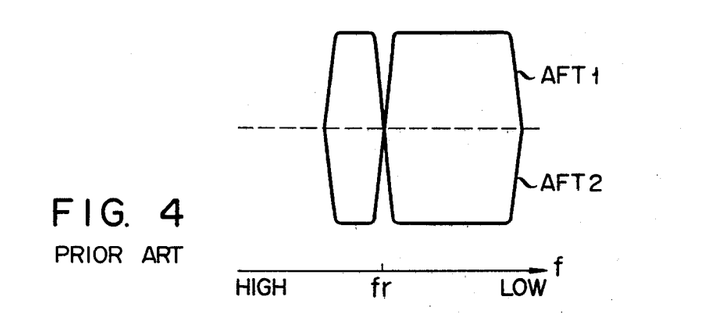
FIG. 4 is a characteristic view showing the general output property of an auto frequency tuning discriminator in a tuner.

The following description covers the case where the AFT signal alone is used to search channels. When the frequency of the carrier of the video IF signals obtained through the tuner and standard frequency $f_r$ (58.75 MHz in Japan and 45.75 MHz in the United States) are compared with each other, the AFT signals correspond to the difference obtained from the comparison and include two signals AFT1 and AFT2 as shown in FIG. 4. Namely, the AFT signals are generated only at the time when the video carrier is present near-by the standard frequency $f_r$. It can be judged using these signals AFT1 and AFT2 that a broadcast signal is present when one of these signals AFT1 and AFT2 is positive or negative. However, the AFT signals rise of fall sharply in the vicinity of $f = f_r$ and it is therefore difficult to discriminate their levels. Namely, a dead zone is caused at the time of discrimination in the vicinity of $f = f_r$, thus making it impossible to judge the presence of a normal broadcast signal.

SUMMARY OF THE INVENTION

The object of the present invention is to provide a channel selecting device capable of preventing wrong operation from being caused by the influence of signals in adjacent channels and the condition under which frequency is allocated to each of channels and also capable of carrying out accurate channel search.

The object of the present invention can be attained by a channel selecting device comprising a tuner including a local oscillator and for receiving transmission signals, a variable frequency divider connected to the tuner and for dividing a frequency of an output signal supplied from the local oscillator at a predetermined frequency dividing ratio corresponding to a given channel, a reference signal generator for generating a reference signal of the reference frequency, a comparator for comparing the phase of an output of the variable frequency divider with the phase of the reference signal and producing a reference output signal in order to control the frequency of the local oscillator corresponding to the phase difference, a first frequency dividing ratio changing section for changing by a predetermined amount the frequency dividing ratio set by the variable frequency divider according to the receiving channel to thereby change the oscillation frequency of the local oscillator, a discriminator for discriminating a broadcast signal under the condition that the output of the local oscillator is frequency-divided by the frequency dividing ratio set by the first frequency dividing ratio changing section, and a second frequency dividing changing section for changing by a predetermined amount the frequency dividing ratio set by the first frequency dividing ratio changing section to the predetermined ratio according to the receiving channel, when the discriminator detects a broadcast signal.

DETAILED DESCRIPTION OF THE PREFERRED EMBODIMENTS

Figure 5:
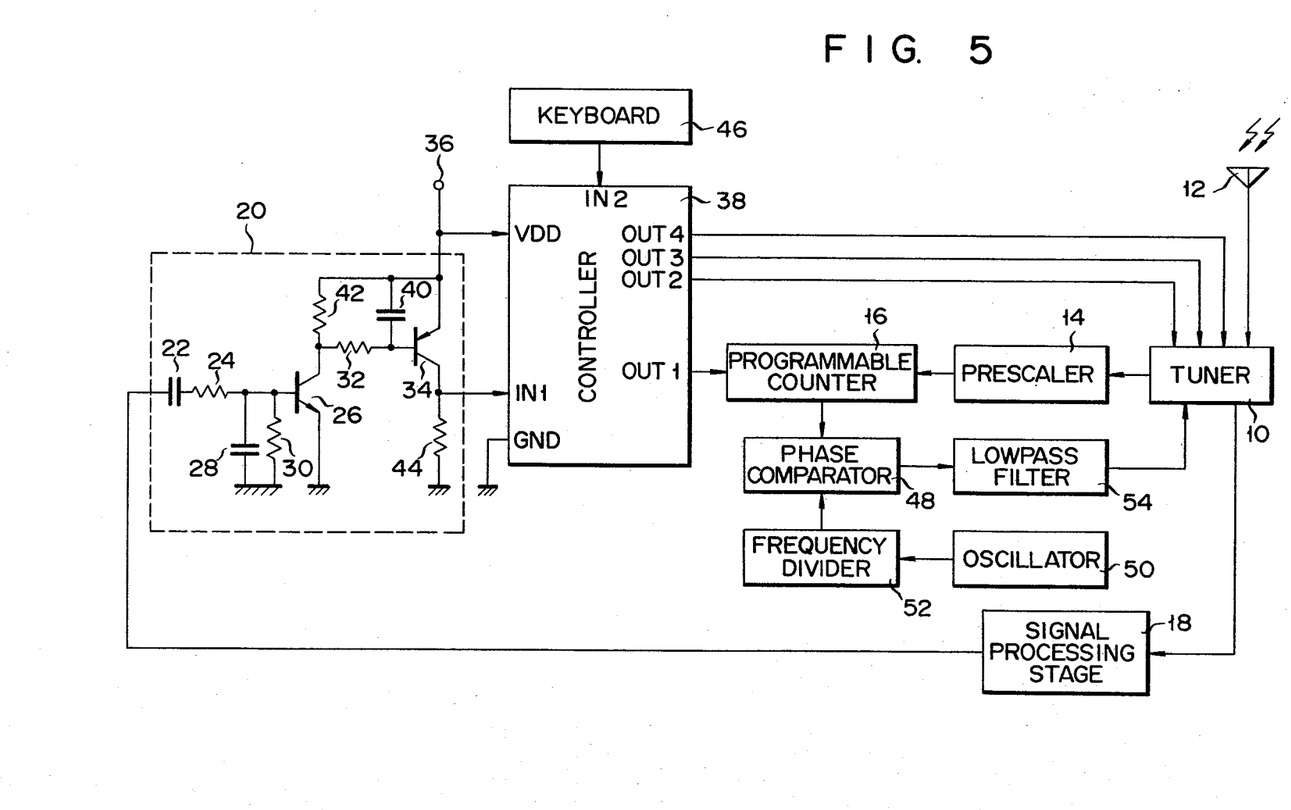
FIG. 5 is a block diagram showing an embodiment of a channel selecting device according to the present invention.

An embodiment of the channel selecting device according to the present invention will be now described with reference to the accompanying drawings. FIG. 5 is a circuit diagram showing the embodiment of the channel selecting device. A tuner 10 including a local oscillator is connected to an antenna 12 and the local oscillation output of tuner 10 is supplied via a prescaler 14 to a programmable counter 16. Tuner 10 is connected to a signal processing stage 18 which includes a video signal processing circuit, color signal processing circuit, deflection circuit, synchronous separator circuit and the like, and the horizontal synchronizing signal is supplied from the synchronous separator circuit to a signal detector 20. The horizontal synchronizing signal is supplied to the base of an NPN type transistor 26 through a capacitor 22 and a resistor 24 which are connected in series. The base of transistor 26 is earthed through a capacitor 28 and a resistor 30 which are connected in parallel. The emitter of transistor 26 is earthed with its collector connected via a resistor 32 to the base of a PNP type transistor 34. The emitter of transistor 34 is connected to a power source terminal 36 and a power source terminal VDD of a controller 38 while to the base thereof via a capacitor 40 and to the collector of transistor 26 via a resistor 42. The collector of transistor 34 is connected to an input terminal IN1 of controller 38 while earthed via a resistor 44. Controller 38 comprises a microcomputer as will be described later. A keyboard 46 is connected to an input terminal IN2 of controller 38. An output terminal OUT 1 of controller 38 is connected to a frequency dividing ratio setting terminal of programmable counter 16 while output terminals OUT2, OUT3 and OUT4 thereof to band switching terminals of tuner 10. An output terminal of programmable counter 16 is connected to a first input terminal of a phase comparator 48. An output of a reference frequency oscillator 50 is supplied via a frequency divider 52 to a second input terminal of phase comparator 48. An output of phase comparator 48 is supplied via a low-pass filter 54 to a control terminal of local oscillator of tuner 10. The local oscillator is a voltage controlled oscillator, for example.

Figure 6:
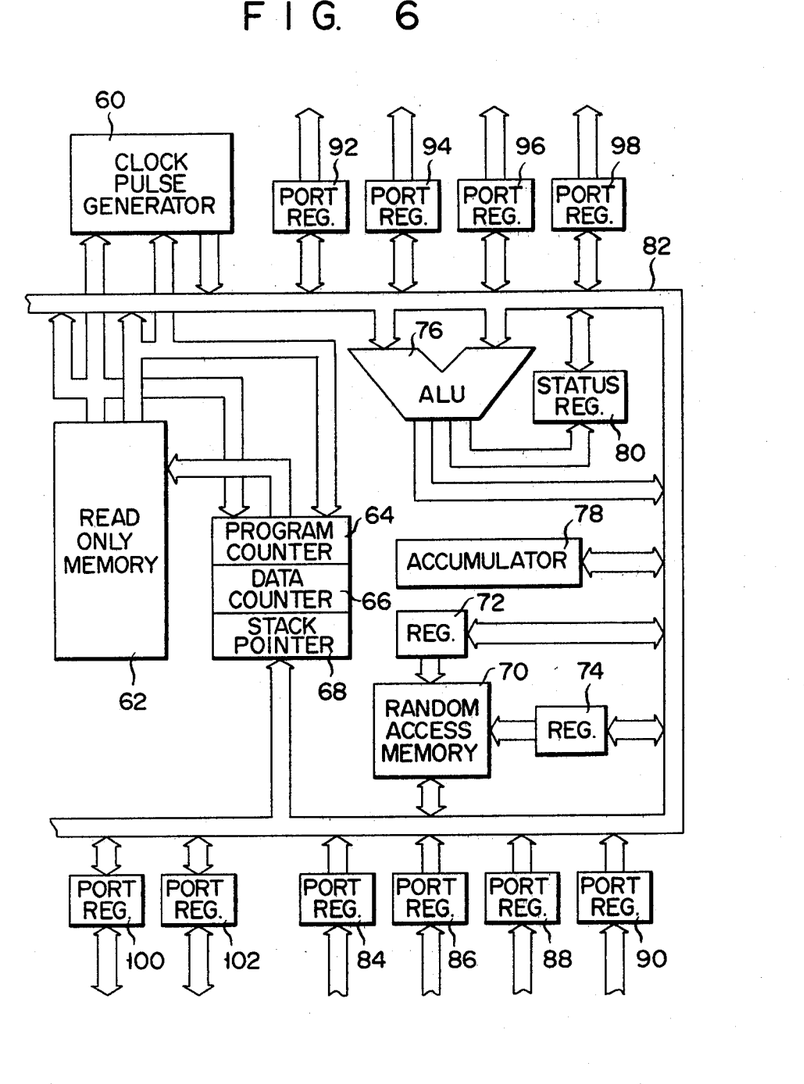
FIG. 6 is a detailed block diagram showing a controller employed in the embodiment of the channel selecting device.

FIG. 6 is a circuit diagram showing the microcomputer which forms the controller 38. A clock pulse generator 60 generates timing signals for determining the driving timing of the microcomputer. A read only memory (ROM) 62 stores processing programs. A program counter 64 indicates addresses of programs stored in ROM 62, and a data counter 66 indicates addresses of fixed data stored in ROM 62. A stack pointer 68 functions as a sheltering area of program counter 64. A random access memory (RAM) 70 functions as a working area of process and pages and addresses of RAM 70 are indicated by registers 72 and 74, respectively. An arithematic logic unit (ALU) 76 carries out a variety of logical operations using an accumulator 78 and a status register 80. Transmission of data among these elements is performed through a bus line 82. Input port registers 84, 86, 88, 90, output port registers 92, 94, 96, 98, and input/output port registers 100, 102 are also adapted for external connection. Input ports 84 and 86 serve as input terminals IN1 and IN2. Output ports 92, 94, 96 and 98 serve as output terminals OUT1, OUT2, OUT3 and OUT4, respectively.

The operation of the embodiment of the channel selecting device shown in FIGS. 5 and 6 and using a horizontal synchronizing signal as a signal for discriminating whether or not a broadcast signal is present will be now described. The operation of channel selecting mode will be described first. The channel selection means that the local oscillation frequency of tuner 10 is set to a predetermined frequency according to each of the channels. The channel selecting operation is carried out by controlling the frequency dividing ratio N of programmable counter 16. Namely, providing that the local oscillation frequency of the tuner is $f_o$, the oscillating frequency of the reference oscillator 50 is f, the frequency dividing ratio of prescaler 14 is n, and the frequency dividing ratio of frequency divider 52 is M, the frequency dividing ratio N of programmable counter 16 is determined according to each of channels as follows:

$$N = Mf_o/nf \qquad (4)$$

Therefore, the channel selection can be achieved when the frequency dividing ratio N of programmable counter 16 is set by the operation of key-board 46 to one corresponding to a desired channel.

Figure 7:
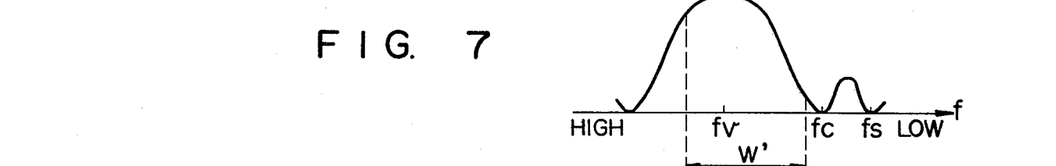
FIG. 7 is a characteristic view showing the band-pass property of an image IF amplifier when the local oscillating frequency is lowered.
Figure 8A:
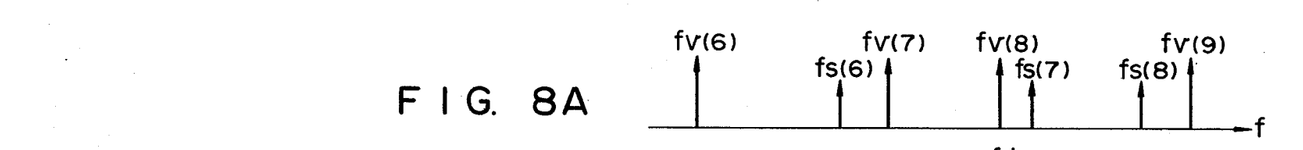
FIGS. 8A through 8C and 9A through 9D are characteristic views to explain effects attained by the embodiment.
Figure 8B:
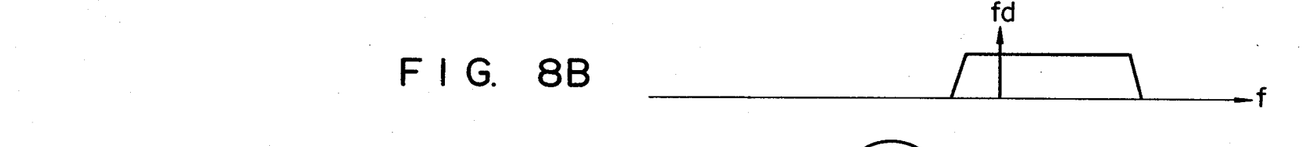
Figure 8C:
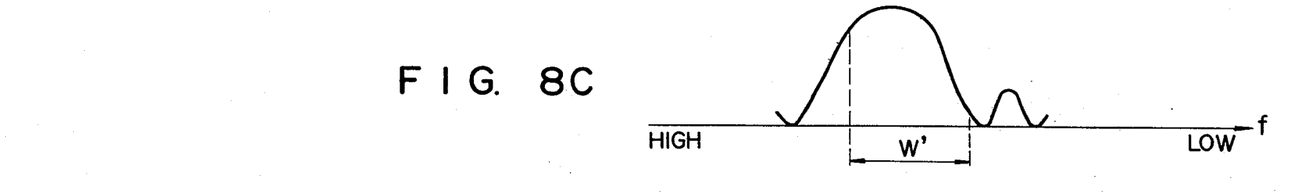
Figure 9A:
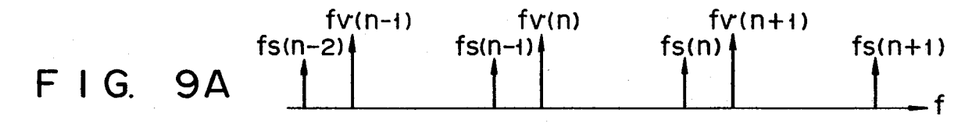
Figure 9B:
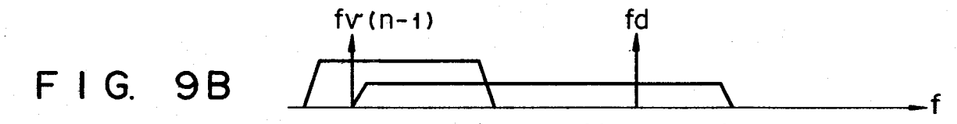
Figure 9C:
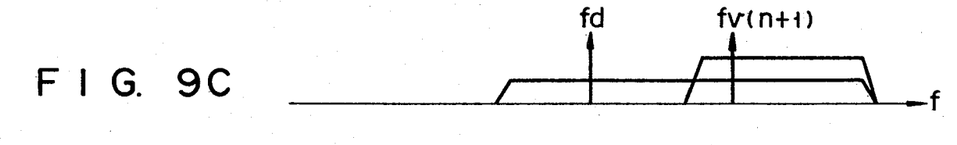
Figure 9D:
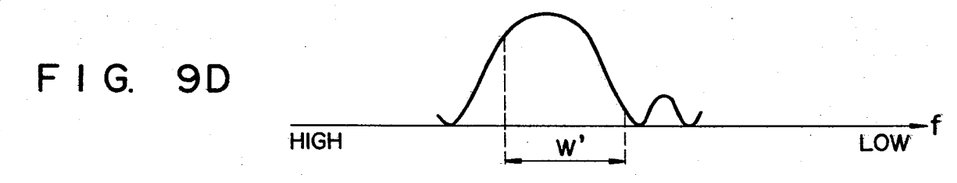

The operation of the channel searching mode according to the present invention will be now described. According to the present invention, the local oscillating frequency of tuner 10 is set at the time of channel searching lower than those under usual image receiving condition. As shown in FIG. 7, the band-pass characteristic of a video intermediate frequency amplifier circuit is normally and previously set by concentrated constants of the circuits used. The band-pass characteristic (or response) relative to frequencies is not changed even if the local oscillation/frequency is varied, but the frequency of each of the carrier components is changed. Namely, when FIG. 7 is compared with FIG. 1, each of carriers $f_v$, $f_c$ and $f_s$ is shifted in the minus direction and the area of w' is reduced as compared with that of W (the right side in the area of w' is reduced because no broadcast signal is present). Even if the area w' is made narrow, signals can be detected in this case in each of the channels in which the broadcast signal is present, and the channel searching function can be achieved perfectly unless the amount of shift is made extremely large. As shown in FIGS. 8A through 8C which correspond to FIGS. 2A through 2C, respectively, an unnecessary video signal $f_d$ in the eighth channel is not detected at the time of receiving those in the seventh channel, thus allowing no mistake to be made in channel searching. As shown in FIGS. 9A through 9D, a mistake in channel searching caused by unnecessary signals in adjacent channels at the time of receiving the video signal in nth channel can also be prevented, the unnecessary signals comprising high harmonic wave components of the video signals in adjacent channels. FIGS. 9A thorugh 9D correspond to FIGS. 3A through 3D, respectively. The carrier frequency of high harmonic wave components of the video signal in a channel which is high by one is in the pass-band of the video intermediate frequency amplifier, but since the side wave components in the high harmonic wave components can be reduced, the cross modulation due to the video signal in a channel which is high by one is eliminated. The detection of the horizontal synchronizing signal is achieved by detector 20. The horizontal synchronizing signal is supplied from signal processing stage 18 to the base of transistor 26 and wave-shaped to be picked up through both ends of resistor 42. After being smoothed by the resistor 32 and capacitor 40, this pulse is supplied to the base of transistor 34. As the result, when the horizontal synchronizing signal is generated from signal processing stage 18, a DC voltage is obtained through both ends of capacitor 40 to render to transistor 34 conductive, so that the output of 1 level (1 and 0 levels will be hereinafter referred to as logical ones) can be picked up through both ends of resistor 44. Inversely, when no horizontal synchronizing signal is applied, no voltage is generated at both ends of capacitor 40 leaving the transistor 34 non-conductive, so that the output of 0 level is generated through both ends of resistor 44. Since the output signal of resistor 44 is supplied to the input terminal IN1 of controller 38, the controller 38 discriminates according to the level at the input terminal IN1 thereof whether or not the broadcast signal is present.

Figure 10:
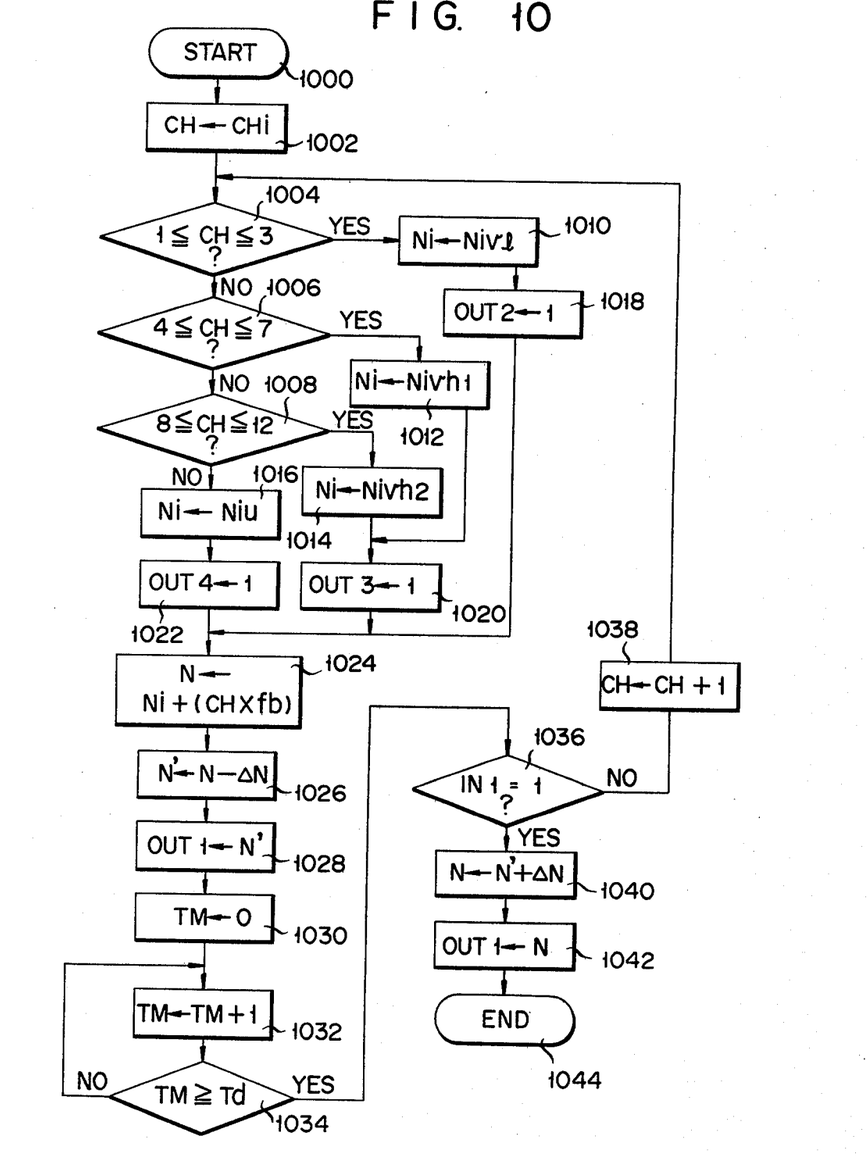
FIG. 10 is a flow chart showing the signal processing operation of this embodiment.

FIG. 10 is a flow chart showing the channel searching operation of controller 38. This program is stored in the ROM 62 and started by the key-board 46 or power supply. A channel number CH to be searched is set to an initial value CHi at a step 1002 next to a start step 1000. The frequency dividing ratio of programmable counter 16 for determining the standard local oscillation frequency of each of channels can be calculated according to equation (4) but also obtained as follows: When frequency ranges of channels are the same and successive, for example, and it is assumed that the frequency dividing ratio corresponding to the lowest channel is Ni, the channel number CH, and the frequency range of one channel $f_b$, the frequency dividing ratio N corresponding to the channel CH is expressed as follows and this following equation is employed in the flow chart.

$$N = Ni + (CH \times f_b) \qquad (5)$$

As frequency bands for television are divided into four groups in Japan, four initial values Ni are present. Therefore, it is discriminated at steps 1004, 1006 and 1008, respectively, whether or not the channel is between first and third channels, fourth and seventh channels, and eighth and twelfth channels, and when respective discriminations are finished, Ni is set at steps 1010, 1012 and 1014 to Niv1, Nivh1 and Nivh2. When the channel is discriminated at step 1008 to be beyond the twelfth channel, that is, in the UHF band, Ni is set at a step 1016 to Niu. The local oscillator in the tuner 10 is switched according to which frequency band the channel belongs to. Therefore, when it is between first and third channels, output terminal OUT2 of controller 38 is set at a step 1018 next to step 1010 to be of level 1, when between fourth and twelfth channels, output terminal OUT3 is set at a step 1020 next to steps 1012 and 1014 to be of level 1, and when beyond the twelfth channel, output terminal OUT4 is set at a step 1022 next to step 1016 to be of level 1. After the band information is supplied to tuner 10 like this, the normal frequency dividing ratio N of programmable counter 16 is calculated at a step 1024 according to equation (5). Thereafter, at a step 1026 the frequency dividing ratio is lowered by ΔN so as to lower the local frequency of tuner 10 by Δf. When the shifted amount Δf of the local oscillation frequency is made too large the broadcast signal itself transmitted through the channel can not be detected. Δf needs to be at least 0.5 MHz to prevent the cross modulation between seventh and eighth channels in Japan and at least $4.5-(f_d-f_{x(n)})$ MHz to prevent the cross modulation from other adjacent channels. A following condition is also needed to change the local oscillation frequency by changing the frequency dividing ratio N of programmable counter 16.

Namely, providing that the local oscillation frequency corresponding to the highest channel is represented by $f_{max}$ (824 MHz in the sixty second channel in Japan) and the frequency band width of each of channels by $f_b$MHz, the frequency dividing ratio N of programmable counter 16 needs to be at least larger than $f_{max}/f_b$, which is employed in the embodiment of the channel selecting device according to the present invention. Alternatively programmable counter 16 is provided with a rate multiplier, pulse swallow counter and the like with a decimal point function, allowing the local oscillation frequency to be set to an optional frequency in transmission bands.

The frequency dividing ratio N' which has resulted from lowering N by ΔN at step 1026 is supplied from output terminal OUT1 of controller 38 to programmable counter 16 at a step 1028, whereby PLL starts lead-in operation to obtain a local oscillation frequency responsive to the frequency dividing ratio N' and the local oscillation frequency is obtained after the lapse of a certain time period. A time-counting operation is carried out at steps 1030, 1032 and 1034 considering this certain time period. It is discriminated at step 1034 whether or not the counted time TM is over the certain time period Td, and when TM is over Td, it is judged that the lead-in operation of PLL has finished and discriminated at a step 1036 whether or not the broadcast signal is present. Namely, when the level of input terminal IN1 of the controller 38 is detected to be level 0, no horizontal synchronizing signal is present. It is therefore judged that no broadcast signal is present, and after the channel number CH is incremented at a step 1038, the step 1004 is again carried out to repeat the process as described above. When the input terminal IN1 is at level 1, it is judged that the broadcast signal is present. The channel searching operation is finished, and the frequency dividing ratio is returned at a step 1040 to $N=N'+\Delta N$ and supplied at a step 1042 from the output terminal OUT1 to the programmable counter 16, whereby tuner 10 is returned to the usual receiving condition.

Figure 11A:
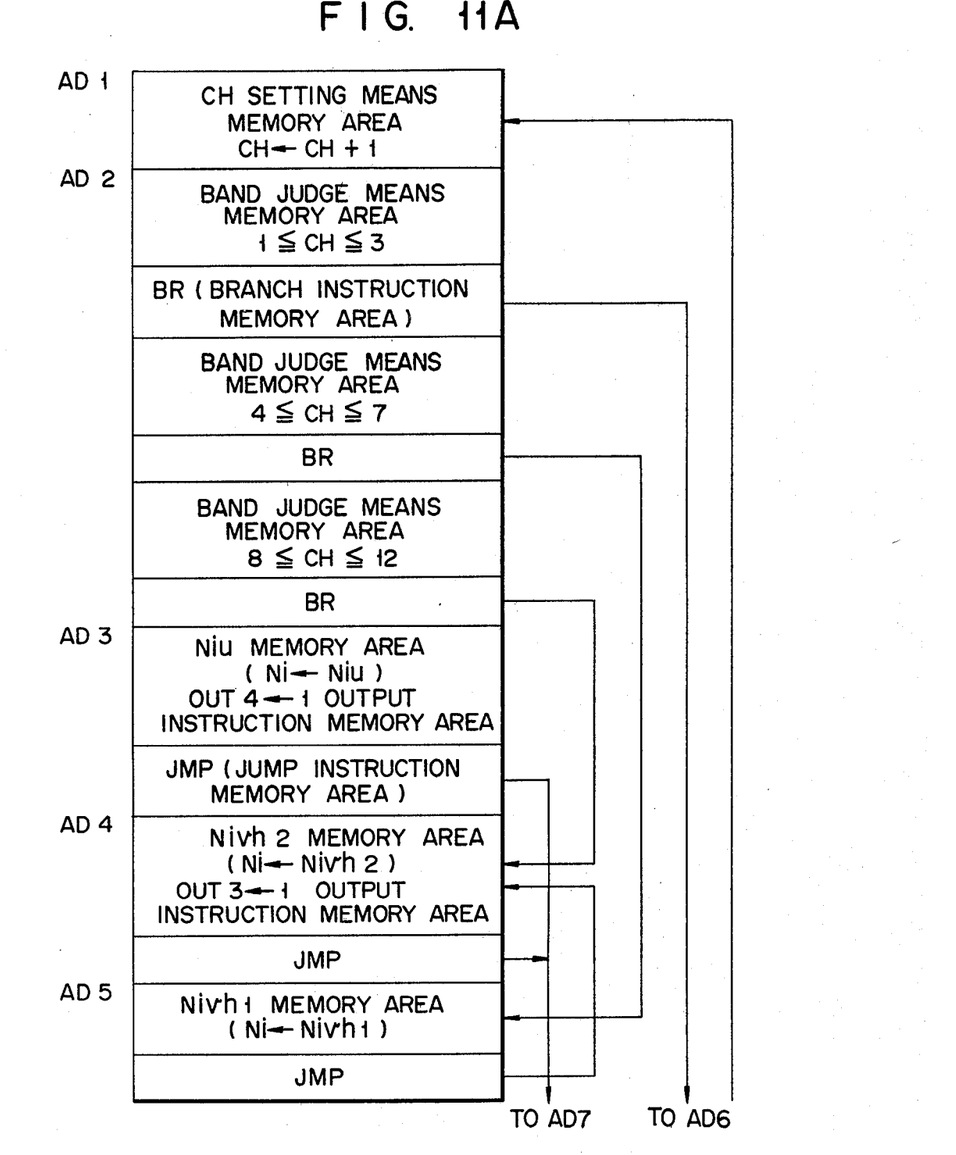
FIGS. 11A and 11B show a memory map of a ROM arranged in this embodiment.
Figure 11B:
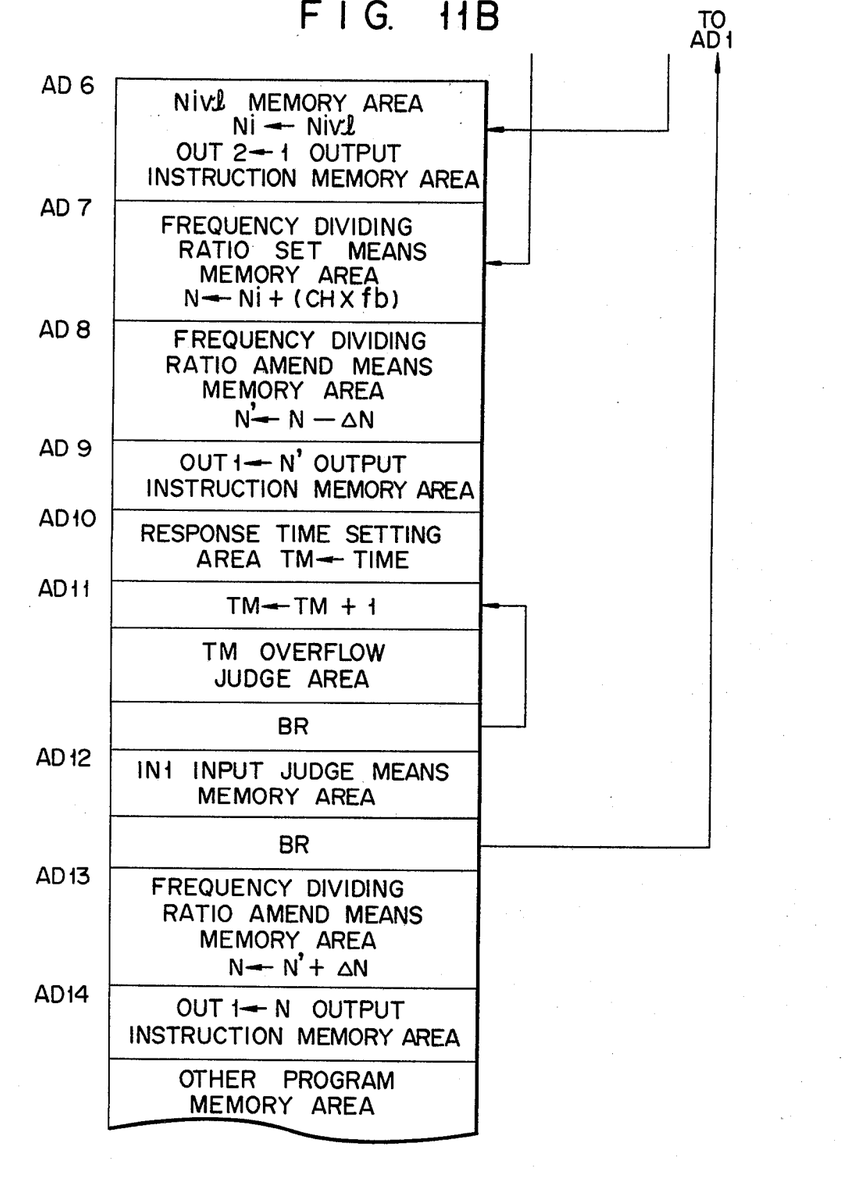
Figure 12:
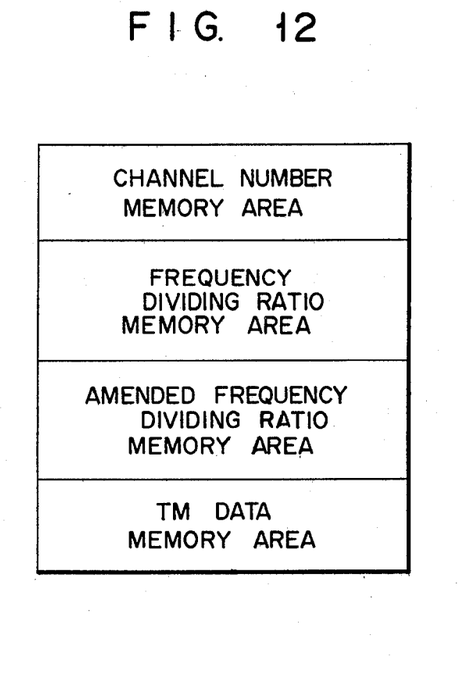
FIG. 12 shows a memory map of a RAM arranged in this embodiment.

Although the channel number is incremented at the step 1038, the initial value of channel number set to the highest may be made to have a decrement. When it is judged that the broadcast signal is present, the operation is finished. However, it may be arranged that all of the channels are searched and the number of channels in which the broadcast signal is present is stored in a memory. Program and data shown in FIG. 10 are stored in the ROM as shown in FIGS. 11A and 11B and in the RAM as shown in FIG. 12.

According to the embodiment of the channel selecting device as described above, the local oscillation frequency is made lower than the normal one at the time of channel searching, thus preventing a mistake in channel searching from being caused because of cross modulation from other channels, and then returned to the normal one after the finish of channel searching, thus preventing the quality of received images from being degraded.

Figure 13:
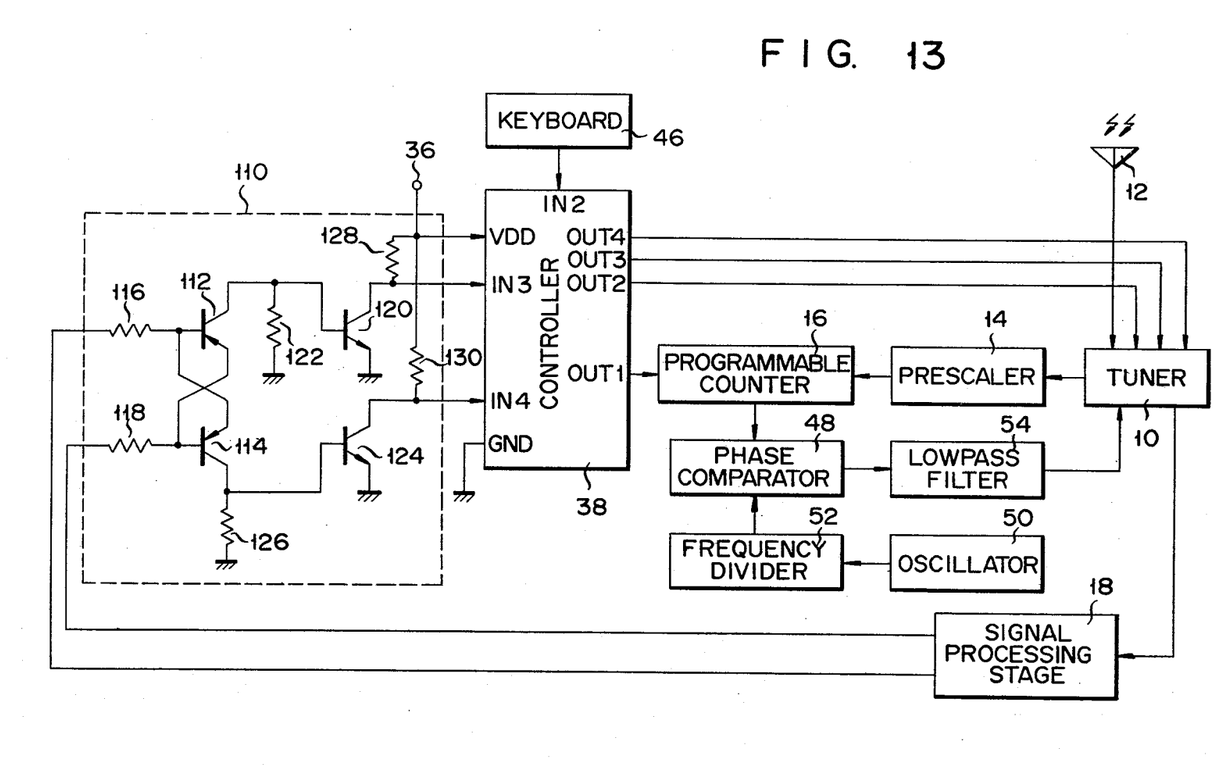
FIG. 13 is a block diagram showing a second embodiment of the channel selecting device according to the present invention.

A second embodiment of the channel selecting device according to the present invention will be now described referring to FIG. 13. The same parts as those in the first embodiment are represented by the same reference numerals and the description about these parts will be omitted. This second embodiment employs the AFT signals instead of the horizontal synchronizing signal to discriminate whether or not the broadcast signal is present. Two AFT signals which are generated from the signal processing stage and which are complementary relative to each other are supplied via resistors 116 and 118 to PNP type transistors 112 and 114 in a signal detector 110, respectively. The emitter of transistor 112 is connected to the base of transistor 114 while the emitter of transistor 114 is connected to the base of transistor 112. The base of transistor 120 is earthed through a resistor 122. The collector of transistor 114 is coupled to the base of an NPN type transistsor 124 while earthed through a resistor 126. The emitters of transistors 120 and 124 are earthed and their collectors are connected to input terminals IN3 and IN4 of a controller 38, respectively, while to a power source terminal 36 through resistors 128 and 130. Other parts are the same as in the first embodiment shown in FIG. 5.

Figures 14A, 14B, 14C:
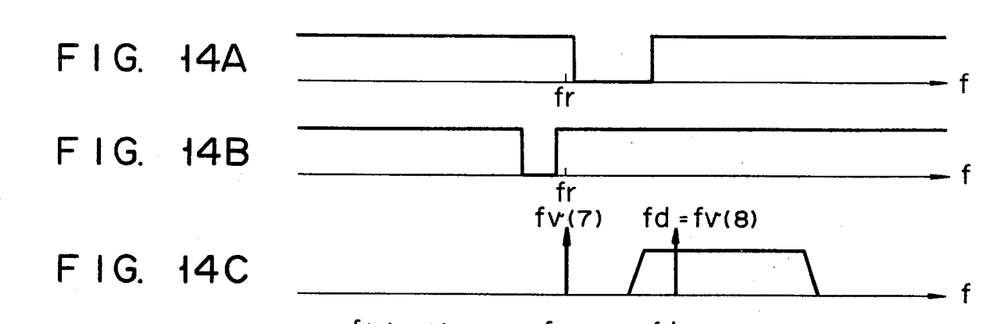
FIGS. 14A through 14G are characteristic views to explain effects attained by this second embodiment.
Figure 14D:
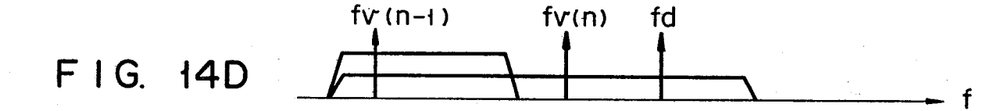
Figure 14E:
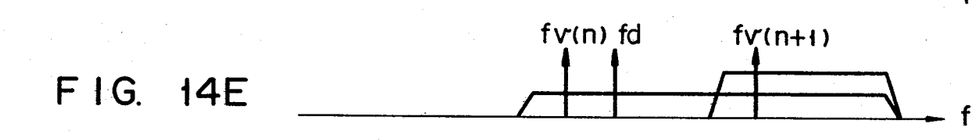
Figure 14F:
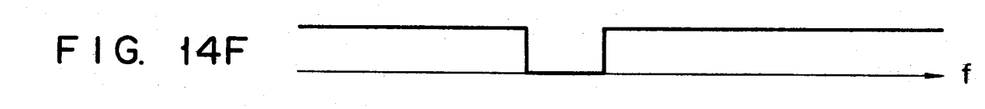
Figure 14G:
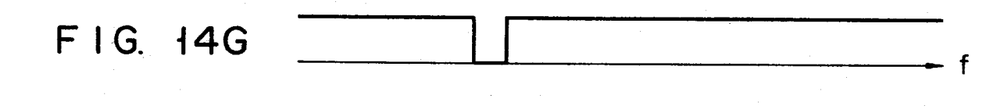

The operation of this second embodiment will be now described. It is assumed that AFT1 and AFT2 signals shown in FIG. 4 are supplied from signal processing stage 18 to transistors 112 and 114, respectively. Resistors 116 and 118 are intended to limit current. When the AFT1 signal > AFT2 signal, transistor 114 is made conductive and when the AFT1 signal < AFT2 signal, transistor 112 is made conductive. Therefore, AFT detection signals of negative logic are generated from the collectors of transistors 120 and 124 at higher and lower portions than the standard frequency $f_r$ as shown in FIGS. 14A and 14B and supplied to input terminals IN3 and IN4 of controller 38, respectively. Even when these two signals are used, they can not be detected adjacent to the standard frequency $f_r$ and a mistake in channel searching is caused because of the cross modulation as shown in FIGS. 14C, 14D and 14E. However, when the local oscillation frequency is lowered, these AFT detection outputs (FIGS. 14A and 14B) are lowered in their frequency bands as shown in FIGS. 14F and 14G, whereby the broadcast signal can be surely detected without using the AFT2 signal (FIG. 14G) if only the AFT1 signal (FIG. 14F) is detected. A flow chart showing the operation of the second embodiment will be omitted because it is same as that in the first embodiment except the manner of discriminating whether or not the broadcast signal is present. Namely, instead of discriminating at the step 1036 shown in FIG. 10 whether or not IN1 is of level 1, it may be discriminated whether or not IN3 is of level 0.

According to this second embodiment, one of two AFT signals can be made unnecessary in addition to the effect of preventing a mistake in channel searching, although two AFT signals have been conventionally employed to discriminate whether or not transmission signals are present.

Although it has been described above that the switching of local oscillation frequency is achieved by the microcomputer, discrete operational circuits or memories may be employed. In addition, the channel searching operation may be automatically started by turning on the television receiving set. Further, the channel selecting device of the present invention may be applied to the radio receiver and the like in addition to the television receiving set. The local oscillation frequency may be elevated in some cases at the time of channel searching mode.

What is claimed is:

1. A channel selecting device comprising:

tuner means, including a local oscillator, for receiving transmission signals;

channel number setting means for specifying a channel number;

means, connected to said tuner, for discriminating a broadcast signal;

variable frequency dividing means, connected to said tuner, for dividing the frequency of an output signal from the local oscillator according to the set channel number;

frequency dividing ratio setting means for setting a frequency dividing ratio of said variable frequency dividing means at a first value so as to make the frequency of the local oscillator lower than a predetermined frequency corresponding to the set channel number when a channel number is set for setting the ratio at a second value so as to make the frequency of the local oscillator equal to the predetermined frequency corresponding to the channel number when said discriminator means discriminates a broadcast signal;

means for generating a reference signal at a reference frequency; and means for comparing the phase of an output signal from said variable frequency dividing means and a phase of an output signal from said reference signal generating means and for controlling the frequency of the local oscillator according to the phase difference therebetween.

2. A channel selecting device according to claim 1, wherein said channel number setting means shifts the channel number by one when said broadcast signal discriminator means does not detect a broadcast signal.

3. A channel selecting device according to claim 1, wherein said tuner means is included in a television receiver and said frequency dividing ratio setting means serves to lower the local oscillation frequency so that the frequency pass-band of a video intermediate frequency amplifier in said tuner means includes neither a carrier nor high harmonic wave component of the video signals in channels adjacent to the receiving channel when a channel number is set.

* * * * *